(12) United States Patent
Koide

(10) Patent No.: US 10,388,674 B2
(45) Date of Patent: Aug. 20, 2019

(54) APPARATUS AND METHOD FOR REDUCING THE WIDTH OF THE FRAME IN DISPLAY DEVICE UTILIZING AN INTER-SUBSTRATE CONNECTING MATERIAL

(71) Applicant: Japan Display Inc., Minato-ku (JP)

(72) Inventor: Gen Koide, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/659,799

(22) Filed: Jul. 26, 2017

(65) Prior Publication Data

US 2018/0033801 A1 Feb. 1, 2018

(30) Foreign Application Priority Data

Jul. 29, 2016 (JP) ................. 2016-149615

(51) Int. Cl.
| | | |
|---|---|---|
| *H01L 27/12* | (2006.01) | |
| *H01L 27/32* | (2006.01) | |
| *G02F 1/1333* | (2006.01) | |
| *G06F 3/041* | (2006.01) | |
| *G02F 1/1335* | (2006.01) | |

(52) U.S. Cl.
CPC ...... *H01L 27/124* (2013.01); *G02F 1/133305* (2013.01); *G06F 3/0412* (2013.01); *H01L 27/3248* (2013.01); *G02F 1/13336* (2013.01); *G02F 1/13338* (2013.01); *G02F 1/133514* (2013.01)

(58) Field of Classification Search
CPC ............................ H01L 27/124; G06F 3/0412
See application file for complete search history.

(56) References Cited

U.S. PATENT DOCUMENTS

| | | | | |
|---|---|---|---|---|
| 9,508,754 B2 * | 11/2016 | Katsuta | ................ | H01L 27/124 |
| 2002/0163614 A1 * | 11/2002 | Hinata | ................. | G02F 1/1339 349/139 |
| 2010/0128009 A1 * | 5/2010 | Okada | ................. | G09G 3/3655 345/205 |
| 2012/0105337 A1 * | 5/2012 | Jun | ....................... | G06F 3/0412 345/173 |
| 2014/0022478 A1 * | 1/2014 | Kim | ..................... | G02F 1/1339 349/43 |

(Continued)

FOREIGN PATENT DOCUMENTS

| | | |
|---|---|---|
| JP | 2002-040465 | 2/2002 |
| JP | 2016-142880 | 8/2016 |

*Primary Examiner* — Mushfique Siddique
(74) *Attorney, Agent, or Firm* — Oblon, McClelland, Maier & Neustadt, L.L.P.

(57) ABSTRACT

A display device is provided, including a first substrate including a first basement, a scanning line extending along the first direction, a drive circuit connected to the scanning line, a first pad and a second pad arranged along a second direction between a first edge of the first basement and the drive circuit, a second substrate including a second basement includes a first surface opposing the first substrate and spaced from the first substrate and a second surface, and a detection electrode located on the second surface, and including a hole which penetrates between the first surface and the second surface, and a connecting material provided through the hole to electrically connect the first pad and the detection electrode to each other.

7 Claims, 13 Drawing Sheets

(56) References Cited

U.S. PATENT DOCUMENTS

| | | | | |
|---|---|---|---|---|
| 2014/0043574 A1* | 2/2014 | Ichimura | ............... | G02F 1/1339 349/138 |
| 2014/0092351 A1* | 4/2014 | Hatakeyama | ......... | G02F 1/1339 349/106 |
| 2014/0198267 A1* | 7/2014 | Jeong | ...................... | G06F 3/041 349/12 |
| 2015/0162357 A1* | 6/2015 | Miyanaga | ............ | H01L 27/1222 257/72 |
| 2016/0155777 A1* | 6/2016 | Kabe | ...................... | H01L 27/32 257/89 |
| 2016/0284735 A1* | 9/2016 | Anjo | .................. | G02F 1/134363 |
| 2017/0269437 A1* | 9/2017 | Chen | ........................ | G06F 3/044 |
| 2018/0031939 A1* | 2/2018 | Imazeki | ............ | G02F 1/136286 |
| 2018/0032194 A1* | 2/2018 | Koide | ................... | G06F 3/0412 |
| 2018/0033969 A1* | 2/2018 | Kamijo | ................. | G02F 1/1345 |
| 2018/0035541 A1* | 2/2018 | Kamijo | ............. | G02F 1/136227 |
| 2018/0035542 A1* | 2/2018 | Osawa | .................. | H05K 1/144 |
| 2018/0210262 A1* | 7/2018 | Osawa | ................. | G02F 1/13452 |
| 2018/0212550 A1* | 7/2018 | Imazeki | ................ | G06F 3/0412 |
| 2018/0213638 A1* | 7/2018 | Osawa | ................. | H05K 1/0298 |

\* cited by examiner

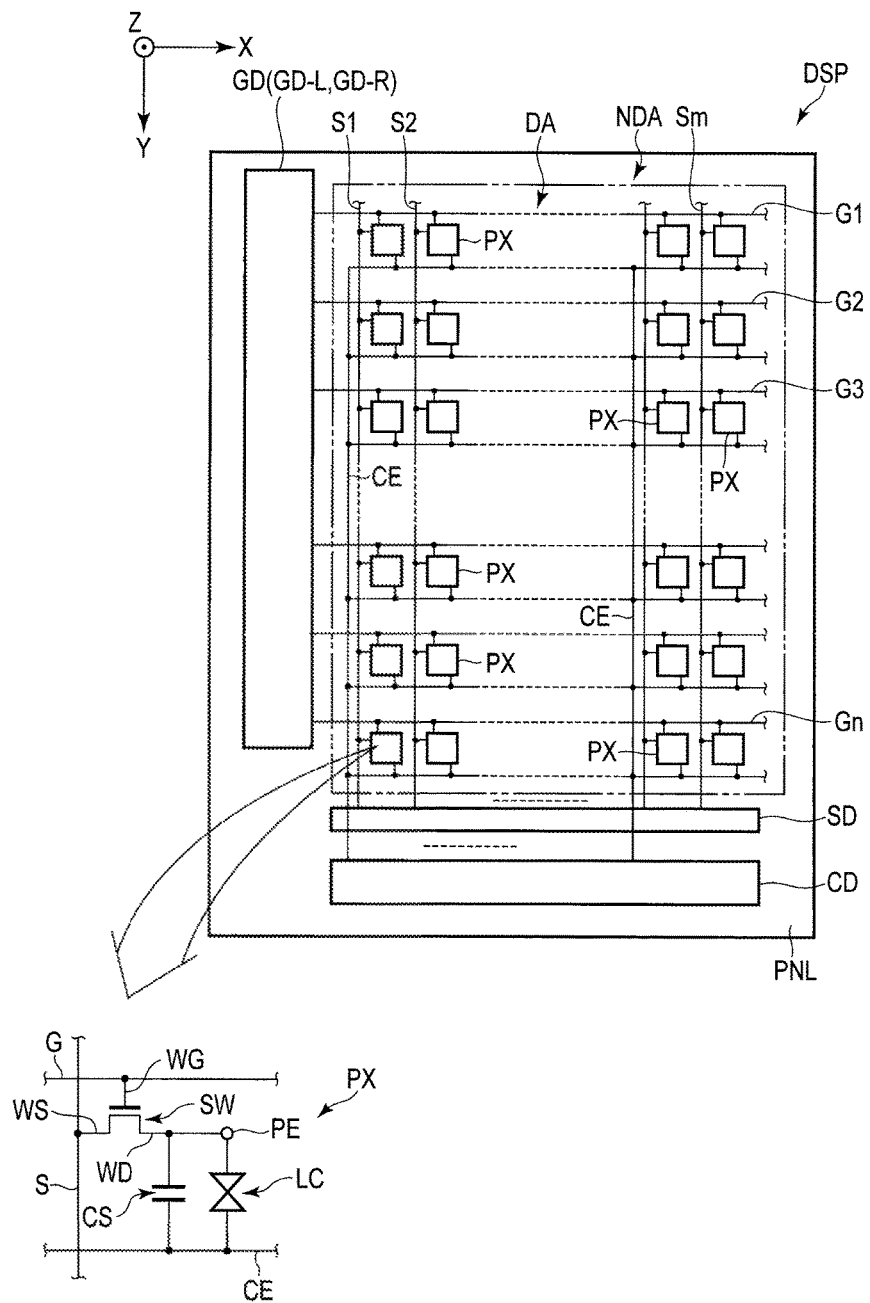
F I G. 2

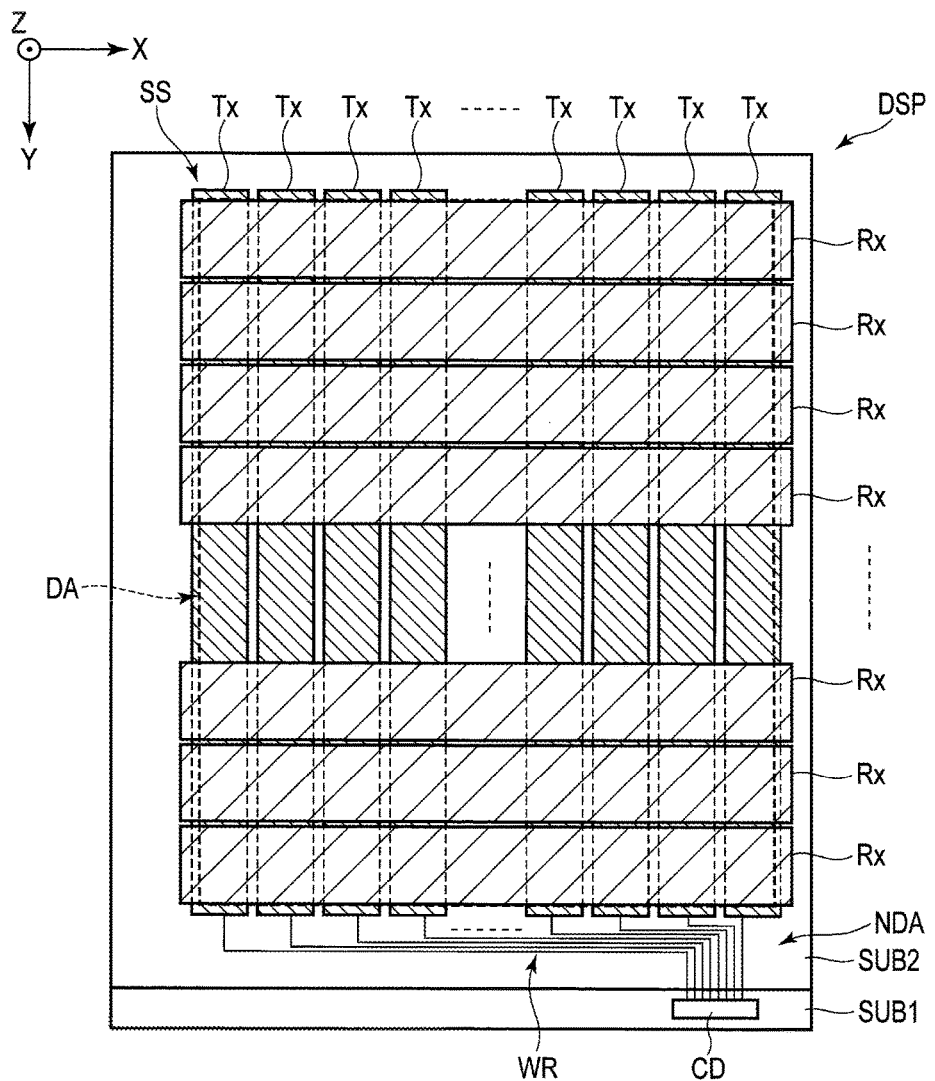
F I G. 4

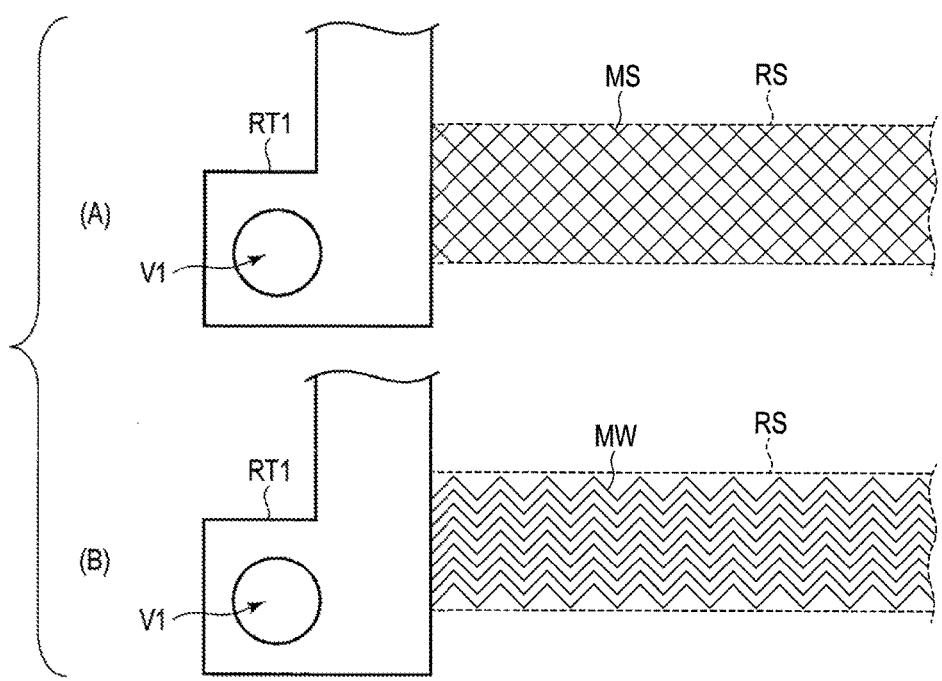
F I G. 5

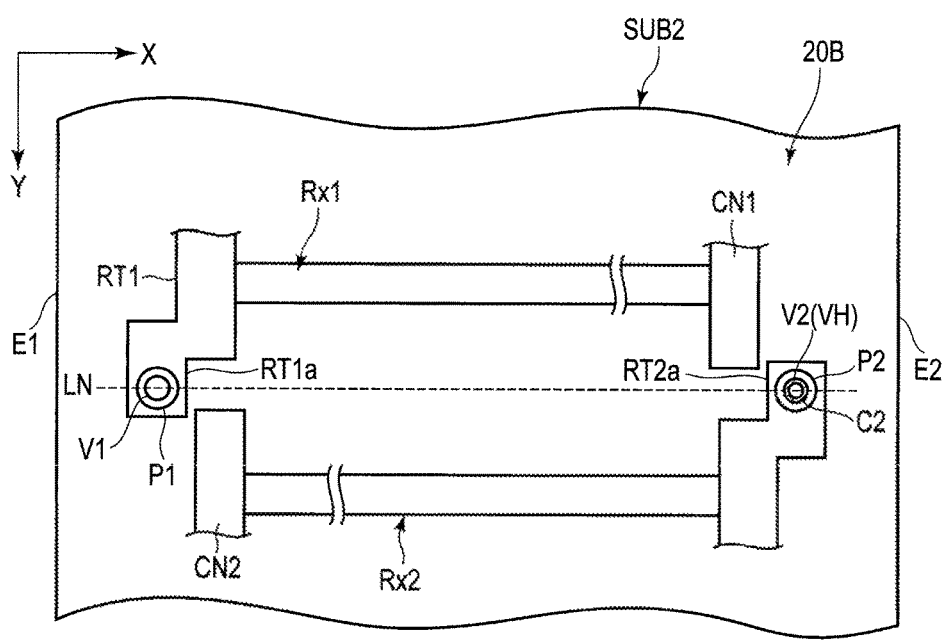
F I G. 8

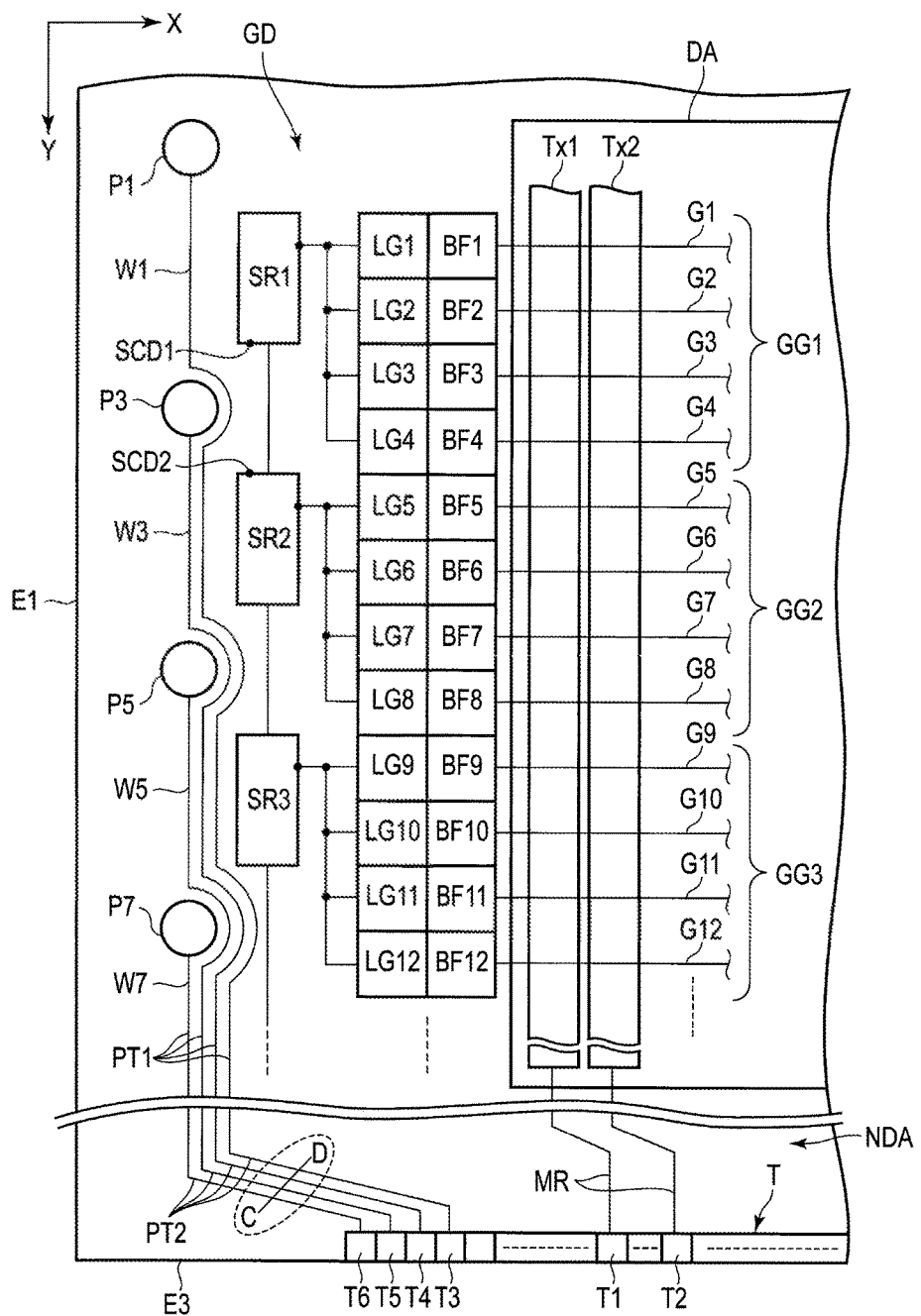
F I G. 9

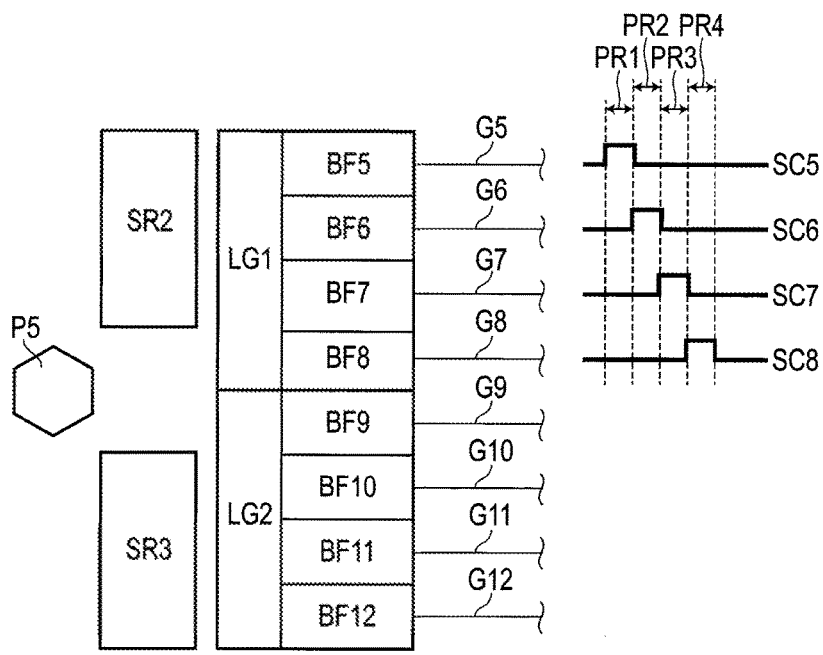
F I G. 11
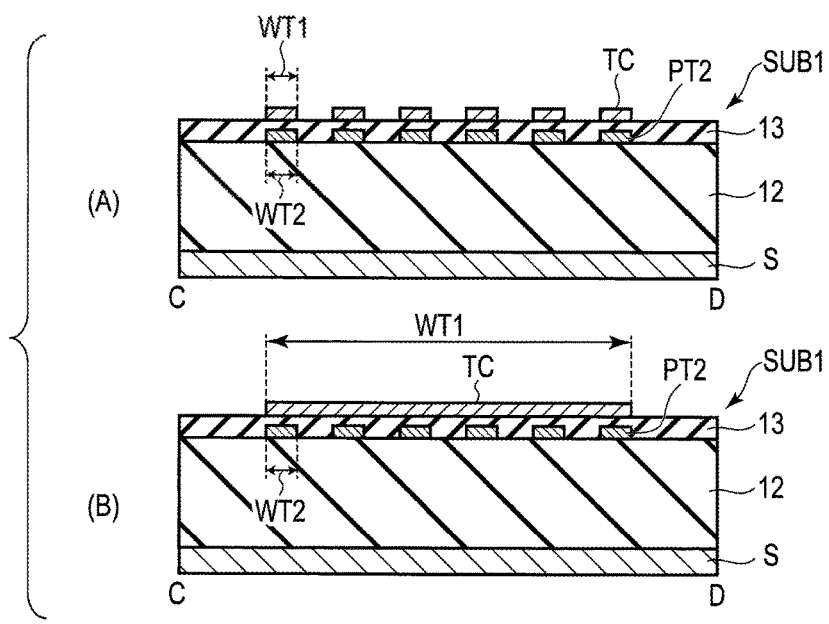
F I G. 12

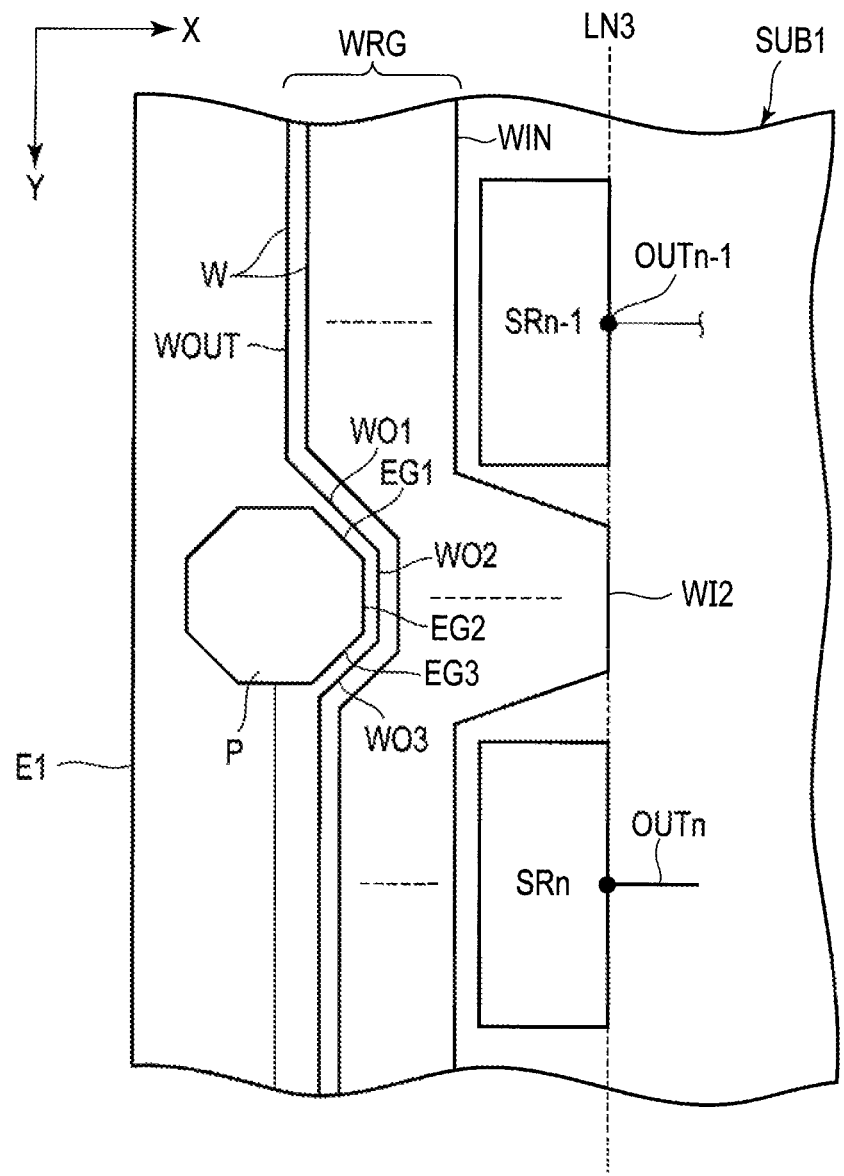
F I G. 13

APPARATUS AND METHOD FOR REDUCING THE WIDTH OF THE FRAME IN DISPLAY DEVICE UTILIZING AN INTER-SUBSTRATE CONNECTING MATERIAL

CROSS-REFERENCE TO RELATED APPLICATIONS

This application is based upon and claims the benefit of priority from Japanese Patent Application No. 2016-149615, filed Jul. 29, 2016, the entire contents of which are incorporated herein by reference.

FIELD

Embodiments described herein relate generally to a display device.

BACKGROUND

In recent years, various techniques for reducing the width of the frame in display devices are being studied. One example discloses a technique of utilizing an inter-substrate connecting material which electrically connects a wiring portion comprising a contact-hole connecting material inside a hole which penetrates an inner surface and an outer surface of a resin-made first substrate, and a wiring portion provided on an inner surface of a resin-made second substrate to each other.

BRIEF DESCRIPTION OF THE DRAWINGS

FIG. 2 is a diagram showing a basic structure and an equivalent circuit of a display panel shown in FIG. 1.
FIG. 4 is a plan view showing a configuration example of a sensor.
FIG. 5 is a diagram showing a configuration example of a detector of a detection electrode shown in FIG. 1.
FIG. 8 is a plan view showing a shape of the detection electrode and positions of the pads in relation to each other, etc.
FIG. 9 is a plan view schematically showing a part of the configuration of the first substrate.
FIG. 11 is a block diagram showing the shift register, logical circuit and buffer circuit shown in FIGS. 9 and 10, accompanied by a timing chart of control signals applied to scanning lines.
FIG. 12 is a cross section showing the first substrate taken along a line C-D shown in FIG. 9.
FIG. 13 is a plan view of the first substrate, showing shift registers adjacent to each other along the second direction Y, a wiring line, and a pad at positions in relation to each other.

DETAILED DESCRIPTION

Figure 1:
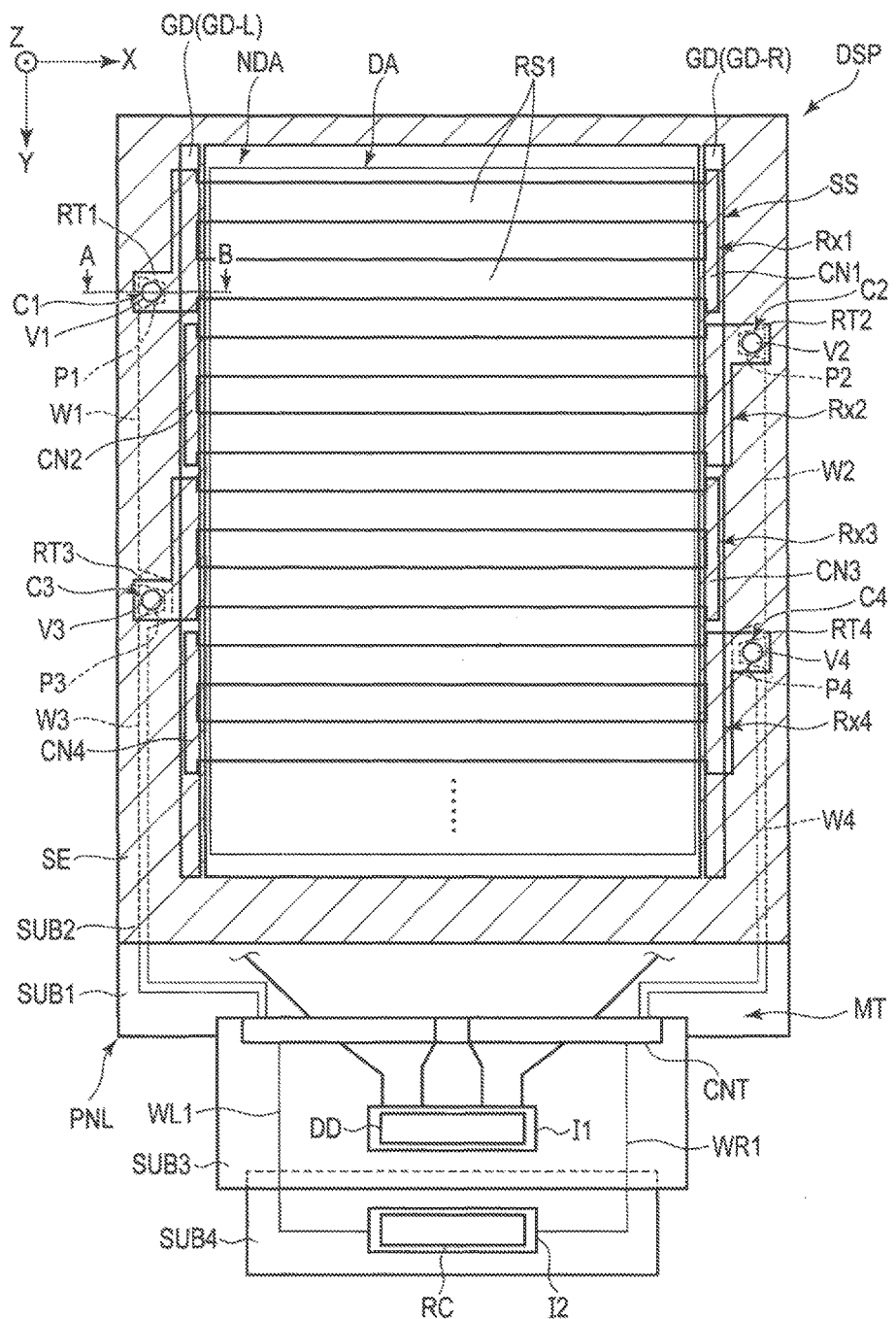
FIG. 1 is a plan view showing a configuration example of a display device of an embodiment.

In general, according to one embodiment, a display device comprises a first substrate including a first basement, a scanning line extending along the first direction, a drive circuit connected to the scanning line, a first pad and a second pad arranged along a second direction crossing the first direction between a first edge of the first basement and the drive circuit, a second substrate including a second basement comprising a first surface opposing the first substrate and spaced from the first substrate and a second surface on an opposite side to the first surface, and a detection electrode located on the second surface, and comprising a hole which penetrates between the first surface and the second surface, and a connecting material provided through the hole to electrically connect the first pad and the detection electrode to each other.

According to another embodiment, a display device comprising: a first substrate including a first basement, a first wiring group and a second wiring group each extending along a first direction and arranged along a second direction crossing the first direction in a display area which displays images, a first shift register connected to the first wiring group, a second shift register connected to the second wiring group and arranged to be spaced from the first shift register at an interval along the second direction, and a first pad provided between the first shift register and the second shift register; a second substrate including a second basement comprising a first surface opposing the first substrate and spaced from the first substrate and a second surface on an opposite side to the first surface, and a first detection electrode located on the second surface, and comprising a first hole which penetrates between the first surface and the second surface; and a first connecting material provided through the first hole to electrically connect the first pad and the first detection electrode to each other.

According to yet another embodiment, a display device comprises a first basement comprising a second edge extending along the first direction and a first edge extending along a second direction crossing the first direction, a display area comprising a scanning line extending along the first direction, a signal line extending along the second direction and a common electrode extending along the second direction, and a non-display area comprising a drive circuit connected to the scanning line, a first pad located between the first edge and the drive circuit, a first wiring line connected to the first pad between the first edge and the drive circuit and extending along the second direction, and a first terminal connected to the first wiring line.

Embodiments will now be described with reference to accompanying drawings. Note that the disclosure is presented for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

In the embodiment, a liquid crystal display device will be disclosed as an example of a display device. The liquid crystal display device can be used in, for example, various types of equipment such as smartphones, tablet terminals, mobile telephone terminals, notebook personal computers, and game consoles. The major configuration explained in the present embodiment can also be applied to a liquid crystal device, a self-luminous display device comprising an organic electroluminescent display element, and the like, an electronic paper display device comprising an electrophoretic element, and the like, a display device employing micro-electromechanical systems (MEMS), or a display device employing electrochromism.

FIG. 1 is a plan view showing a configuration example of a display device DSP of this embodiment.

Here, a liquid crystal display in which a sensor SS is installed will be described as an example of the display device DSP. A first direction X, a second direction Y, and a third direction Z are orthogonal to each other, but they may cross at an angle other than 90 degrees. The first direction X and the second direction Y are parallel to a surface of a substrate of the display device DSP, and the third direction Z is a thickness direction of the display device DSP. Here, FIG. 1 shows a plan view of the display device DSP in an X-Y plane defined by the first direction X, and the second direction Y. In the following descriptions, a view of the X-Y plane from the third direction Z defined as a plan view.

The display device DSP comprises a display panel PNL, an IC chip I1, an IC chip I2, a wiring substrate SUB3, a wiring substrate SUB4, scanning line drive circuits GD (GD-L and GD-R), a connector CNT, etc. The display panel PNL is a liquid crystal display panel, and comprises a first substrate SUB1, a second substrate SUB2, a sealing member SE and a display function layer (liquid crystal layer LC, which will be described later). The second substrate SUB2 opposes the first substrate SUB1. The sealing member SE is equivalent to a hatched portion shown in FIG. 1 and attaches the first substrate SUB1 and the second substrate SUB2 together. The display panel PNL comprises display area DA which displays images and a frame-shaped non-display area NDA surrounding the display area DA. The sealing member SE is located in the non-display area NDA and the display area DA is located in an inner side encircled by the sealing member SE.

The wiring substrate SUB3 is mounted on the first substrate SUB1. The wiring substrate SUB4 is mounted on the wiring substrate SUB3. The wiring substrates SUB3 and SUB4 are, for example, flexible substrates with flexibility. Note that a flexible substrate applicable to this embodiment should only comprise at least partially a flexible portion of a bendable material. For example, the wiring substrates SUB3 and SUB4 of this embodiment each may be a flexible substrate in its entirety, or may be a rigid flexible substrate comprising a rigid portion formed of a rigid material such as glass epoxy and a flexible portion formed of a bendable material such as polyimide.

The scanning line drive circuits GD (GD-L and GD-R) are located in the non-display area NDA. The connector CNT is located in a mounting portion MT of the first substrate SUB1, which extends outwards from the second substrate SUB2. The connector CNT electrically connects various wiring lines etc. arranged on the first substrate SUB1 to the wiring substrate SUB3.

The IC chip I1 is mounted on the wiring substrate SUB3. Note that this configuration is not limited to the example illustrated, but the IC chip I1 may be mounted on the mounting portion MT of the first substrate SUB1 or on the wiring substrate SUB4. The IC chip I1 includes, for example, a built-in display driver DD which outputs a signal required to display images. The display driver DD described here contains at least a part of signal line drive circuits SD, scanning line drive circuits GD and common electrode drive circuits CD, which will be described later.

The IC chip I2 is mounted on the wiring substrate SUB4. Note that this configuration is not limited to the example illustrated, but the IC chip I2 may be mounted on the mounting portion MT of the first substrate SUB1 or on the wiring substrate SUB3. The IC chip I2 contains a built-in detector RC which functions as a touch-panel controller or the like. The detector RC may be built in the IC chip I1 or an IC chip other than the IC chip I1 or I2.

The display panel PNL may be, for example, any one of a transmissive type which displays images by selectively transmitting light from below the first substrate SUB1, a reflective type which displays images by selectively reflecting light from above the second substrate SUB2 and a trans-reflective type comprising a transmissive display function and a reflective display function.

In this embodiment, the direction from the first substrate SUB1 towards the second substrate SUB2 is defined as up or above, and the direction from the second substrate SUB2 towards the first substrate SUB1 is defined as down or below.

A sensor SS carries out sensing to detect contact or approaching of an object with respect to the display device DSP. The sensor SS comprises a plurality of detection electrodes Rx (Rx1, Rx2, Rx3, Rx4, . . . ). The detection electrodes Rx are each formed on the second substrate SUB2. These detection electrodes Rx each extend in the first direction X and are arranged along the second direction Y with gaps therebetween.

FIG. 1 illustrates detection electrodes Rx1 to Rx4 as the detection electrodes Rx, and here a configuration example thereof will be described focusing on the detection electrode Rx1. That is, the detection electrode Rx1 comprises detectors RS1, a terminal RT1 and a connector CN1.

The detector RS1 is located in the display area DA, and extends in the first direction X. In the detection electrode Rx1, the detector RS1 is mainly used for sensing. In the example illustrated, the detector RS1 is formed into a belt-like shape, but more specifically, it is formed from an aggregate of fine metal thin wires as illustrated in FIG. 5. Further, one detection electrode Rx1 comprises two detectors RS1, but may comprise three or more detectors RS1, or may comprise only one detector RS1.

The terminal RT1 is located on one end side of the non-display area NDA, along the first direction X, and is connected to a plurality of detectors RS1. The connector CN1 is located on the other end side of the non-display area NDA along the first direction X and connects the plurality of detectors RS1 to each other. In FIG. 1, the one end side is on the left of the display area DA and the other end side is on the right thereof. A part of the terminal RT1 is formed in a position overlapping the sealing member SE in plan view.

On the other hand, the first substrate SUB1 comprises a pad P1 and a wiring line W1, electrically connected to the wiring substrate SUB3. The pad P1 and the wiring line W1 are located in the one end side of the non-display area NDA and overlap the sealing member SE in plan view. The pad P1 is formed in a position which overlaps the terminal RT1 in plan view. The wiring line W1 is connected to the pad P1, extending along the second direction Y, and is electrically connected to the detector RC of the IC chip I1 via the wiring substrate SUB3.

A contact hole V1 is formed in a position where the terminal RT1 and the pad P1 oppose each other. The contact hole V1 penetrates the second substrate SUB2 including the terminal RT1 and the sealing member SE. Further, the contact hole V1 may penetrate the pad P1. As will be described later, a conductive connecting material C is formed in the contact hole V1. Thereby, the terminal RT1 and the pad P1 are electrically connected to each other. That is, the detection electrode Rx1 provided in the second substrate SUB2 is electrically connected to the detector RC via the wiring substrate SUB3 connected to the first substrate SUB1. The detector RC reads a sensor signal output from the detection electrode Rx to detect whether an object contacts or approaches, and the position coordinate of the object detected, etc.

In the example illustrated, the contact hole V1 is circular in plan view, but the shape thereof is not limited to that of the example illustrated, but may be some other shape such as elliptical.

In the example illustrated, the components of the odd-numbered detection electrodes Rx1, Rx3, . . . , namely, the terminals RT1, RT3, . . . , the pads P1, P3, . . . , the wiring lines W1, W3, . . . , and the contact holes V1, V3, . . . , are all located in the one end side of the non-display area NDA. On the other hand, the components of the even-numbered detection electrodes Rx2, Rx4, . . . , namely, the terminals RT2, RT4, . . . , the pads P2, P4, . . . , the wiring lines W2, W4, . . . , and the contact holes V2, V4, . . . , are all located in the other end side of the non-display area NDA. With such a layout, the width of one end side of the non-display area NDA and the width of the other end side can be equalized, thereby making it easier to reduce the width of the frame.

As illustrated, with the layout in which the pad P3 is closer to the wiring substrate SUB3 than the pad P1, the wiring line W1 detours around the inner side to the pad P3 (the side closer to the display area DA), and is located along and on the inner side of the wiring line W3 between the pad P3 and the wiring substrate SUB3. Similarly, the wiring line W2 detours around the inner side to the pad P4, and is located along and on the inner side of the wiring line W4 between the pad P4 and the wiring substrate SUB3.

FIG. 2 is a diagram showing a basic structure and an equivalent circuit of the display panel PNL shown in FIG. 1.

The display panel PNL comprises a plurality of pixels PX in the display area DA. Here, each pixel indicates a minimum unit individually controllable according to a pixel signal, and exists in the region containing a switching element provided at a position where a scanning line and a signal line cross each other, for example, which will be described later. The pixels PX are arranged in a matrix along the first direction X and the second direction Y. Further, the display panel PNL comprises a plurality of scanning lines G (G1 to Gn), a plurality of signal lines S (S1 to Sm), common electrodes CE, etc., in the display area DA. The scanning lines G each extend along the first direction X and are arranged along the second direction Y. The signal lines S each extend along the second direction Y and are arranged along the first direction X. The scanning lines G and the signal lines S are not necessarily formed to extend linearly, but may be partially bent. The common electrodes CE are each provided for a plurality of pixels PX. The scanning lines G, the signal lines S and the common electrodes CE are all drawn out to the non-display area NDA. In the non-display area NDA, the scanning lines G are connected to the scanning line drive circuit GD, the signal lines S are connected to the signal line drive circuit SD, and the common electrodes CE are connected to the common electrode drive circuit CD. The signal line drive circuit SD, the scanning line drive circuit GD and the common electrode drive circuit CD may be partially or entirely built in the IC chip I1 shown in FIG. 1 or formed on the first substrate SUB1.

Each pixel PX comprises a switching element SW, a pixel electrode PE, a common electrode CE, a liquid crystal layer LC, etc. The switching element SW is, for example, a thin film transistor (TFT) and is electrically connected to a respective scanning line G and a respective signal line S. More specifically, the switching element SW comprises a gate electrode WG, a source electrode WS and a drain electrode WD. The gate electrode WG is electrically connected to the scanning line G. In the example illustrated, the electrode electrically connected to the signal line S is referred to as the source electrode WS, and the electrode electrically connected to the pixel electrode PE is referred to as the drain electrode WD.

The scanning line G is connected to the switching element SW in each of those pixels PX which are arranged along the first direction X. The signal line S is connected to the switching element SW in each of those pixels PX arranged along the second direction Y. Each of the pixel electrodes PE opposes the respective common electrode CE and drives the liquid crystal layer LC with an electric field produced between the pixel electrode PE and the common electrode CE. A storage capacitor CS is formed, for example, between the common electrode CE and the pixel electrode PE.

Figure 3:
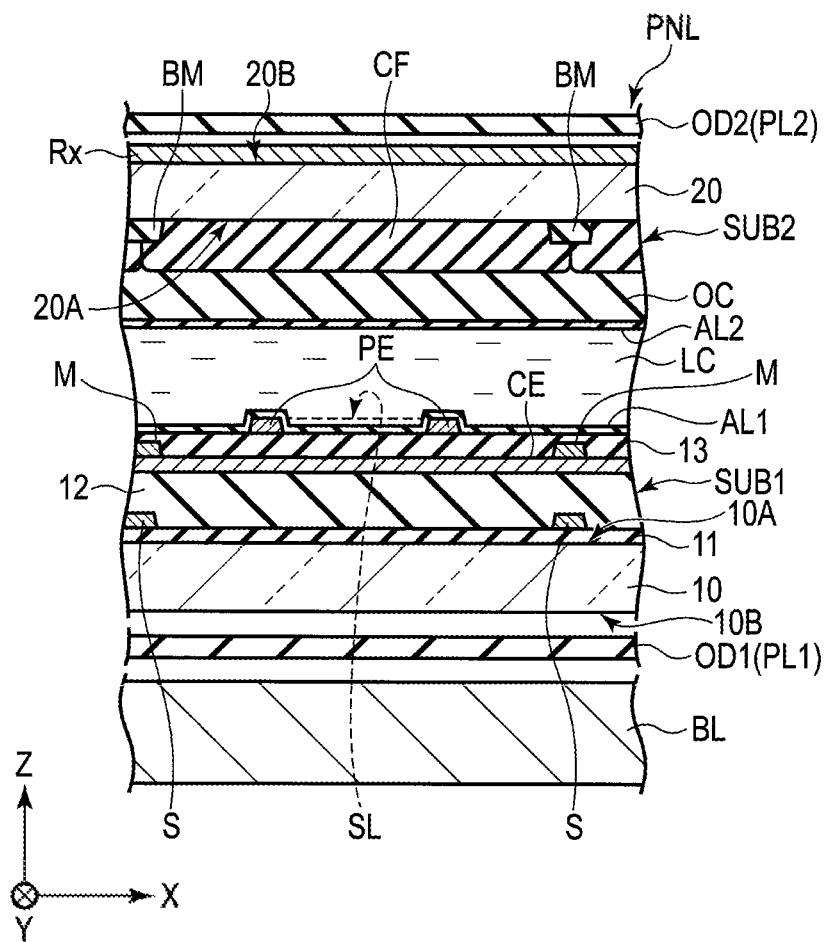
FIG. 3 is a cross-sectional view showing the structure of a part of the display panel shown in FIG. 1.

FIG. 3 is a cross section showing a part of structures of the display panel PNL shown in FIG. 1. Here, a cross section of the display device DSP cut along the first direction X is shown. The first substrate SUB1 and the second substrate SUB2 oppose the third direction Z.

The display panel PNL illustrated here has a structure provided for the display mode which mainly uses a lateral electric field substantially parallel to a surface of the substrate. The display panel PNL may have a structure provided for display mode using a vertical electric field perpendicular to the surface of the substrate, or an electric field oblique to the surface, or a combination thereof. To the display mode using a lateral electric field, for example, such a structure is applicable, that both of the pixel electrode PE and the common electrode CE are provided one of the first substrate SUB1 and the second substrate SUB2. To the display mode using a vertical electric field or an oblique electric field, for example, such a structure is applicable, that one of the pixel electrode PE and the common electrode CE is provided on the first substrate SUB1, and the other one of the pixel electrode PE and the common electrode CE is provided on the second substrate SUB2. Note that the surface of the substrate here is that parallel to the X-Y plane.

The first substrate SUB1 comprises an insulating first basement 10, signal lines S, a common electrode CE, metal layers M, a pixel electrode PE, a first insulating layer 11, a second insulating layer 12, a third insulating layer 13, a first alignment film AL1, etc. Note that the illustration of the switching element, scanning lines and various insulating layers interposed between these, etc., is omitted.

The first basement 10 comprises a surface 10A opposing the second substrate SUB2 and a surface 10B on an opposite side to the surface 10A. The first insulating layer 11 is located on the surface 10A of the first basement 10. The signal lines S are located on the first insulating layer 11. The second insulating layer 12 is located on the signal lines S and the first insulating layer 11. The common electrode CE is located on the second insulating layer 12. The metal layers M are in contact with the common electrode CE at positions directly on the signal lines S, respectively. In the example illustrated, the metal layers M are located on the common electrode CE, but may be located between the common electrode CE and the second insulating layer 12. The third insulating layer 13 is located on the common electrode CE and the metal layers M. The pixel electrode PE is located on the third insulating layer 13. The pixel electrode PE opposes the common electrode CE via the third insulating layer 13. The pixel electrode PE comprises a slit SL in a position opposing the common electrode CE. The first alignment film AL1 covers the pixel electrode PE and the third insulating layer 13.

The structure of the first substrate SUB1 is not limited to the example illustrated, but the pixel electrode PE may be located between the second insulating layer 12 and the third insulating layer 13 and the common electrode CE may be located between the third insulating layer 13 and the first alignment film AL1. In such a case, the pixel electrode PE is formed into a plate shape without a slit, and the common electrode CE is formed to comprise a slit which opposes the pixel electrode. Or both of the pixel electrode PE and the common electrode CE may be each formed into a comb teeth shape and arranged to engage with each other in gear.

The second substrate SUB2 comprises an insulating second basement 20, light-shielding layers BM, color filters CF, an overcoat layer OC, a second alignment film AL2, etc.

The second basement 20 comprises a surface 20A opposing the first substrate SUB1 and a surface 20B on an opposite side to the surface 20A. The light-shielding layer BM and the color filter CF are located in the surface 20A of the second basement 20. The light-shielding layers BM partition the pixels from each other and are is located directly above the signal lines S, respectively. The color filters CF opposes the pixel electrode PE and partially overlap the light-shielding layer BM. The color filter CF includes a red color filter, a green color filter, a blue color filter and the like. The overcoat layer OC covers the color filter CF. The second alignment film AL2 covers the overcoat layer OC.

The color filter CF may be disposed on the first substrate SUB1. The color filter CF may include color filters of four or more colors. On a pixel to display a white color, a white color filter or an uncolored resin material may be disposed or the overcoat layer OC may be disposed without disposing the color filter.

A detection electrode Rx is located on the surface 20B of the second basement 20. The detection electrode Rx correspond to the detection electrode Rx1, may be formed from a conductive layer containing a metal or a transparent conductive material such as ITO or IZO, or formed by depositing a transparent conductive layer on a conductive layer containing a metal, or formed of a conductive organic material or a dispersing element of a fine conductive material or the like.

A first optical element OD1 including a first polarizer PL1 is located between the first basement 10 and an illumination device BL. A second optical element OD2 including a second polarizer PL2 is located on the detection electrode Rx. Each of the first optical element OD1 and the second optical element OD2 may include a retardation film as needed.

Each of the first basement 10 and the second basement 20 may be formed from, for example, no alkali glass, or a resin material. The scanning lines, the signal lines S, and the metal layer M are formed of metals such as molybdenum, tungsten, titanium and aluminum and may be formed in a single- or multi-layer structure. For example, the scanning lines are formed of a metal material containing molybdenum and tungsten, the signal lines S are formed of a metal material containing titanium and aluminum, and the metal layer M is formed of a metal material containing molybdenum and aluminum. Thus, the scanning lines, the signal lines S and the metal layer are formed of metal materials different from each other. The common electrode CE and the pixel electrodes PE are each formed of a transparent conductive material such as ITO or IZO. The first insulating layer 11 and the third insulating layer 13 are inorganic insulating layers while the second insulating layer 12 is an organic insulating layer.

Next, a configuration example of the sensor SS built in the display device DSP of this embodiment will be explained. The sensor SS explained below is, for example, a capacitive sensor of a mutual-capacitive type, which detects contact or approach of an object, based on the variation in electrostatic capacitance between a pair of electrodes opposing via a dielectric.

FIG. 4 is a plan view showing a configuration example of the sensor SS.

In the configuration example illustrated, the sensor SS comprises sensor drive electrodes Tx and detection electrodes Rx.

In the example illustrated, the sensor drive electrodes Tx correspond to portions hatched by lines downwardly slanting to the right and are provided on the first substrate SUB1. The detection electrodes Rx correspond to portions hatched by lines upwardly slanting to the right and are provided on the second substrate SUB2. The drive electrodes Tx and the detection electrodes Rx cross each other in the X-Y plane. The detection electrodes Rx oppose the sensor drive electrodes Tx along the third direction Z.

The drive electrodes Tx and the detection electrodes Rx are located in the display area DA and some of the electrodes extend out to the non-display area NDA. In the example illustrated, the drive electrodes Tx are each formed in a strip shape extending along the second direction Y and arranged along the first direction X to be spaced apart from each other. The detection electrodes Rx each extend along the first direction X and are arranged along the second direction Y to be spaced apart from each other. The detection electrodes Rx are connected to the pads provided on the first substrate SUB1 and electrically connected to the detection circuit RC via the wiring lines as explained with reference to FIG. 1. Each of the drive electrodes Tx is electrically connected to the common electrode drive circuit CD via a wiring line WR. The number, size and shape of the drive electrodes Tx and the detection electrodes Rx are not particularly limited but can be variously changed.

The drive electrodes Tx each include the above-described common electrode CE, have a function of generating an electric field between itself and the respective pixel electrode PE and also a function of detecting the position of the object by generating the capacitance between itself and the respective detection electrode Rx.

The common electrode driving circuit CD supplies common drive signals to the drive electrodes Tx including the common electrode CE at the display driving time to display images on the display area DA. Further, the common electrode drive circuit CD supplies sensor drive signals to the sensor drive electrodes Tx at the sensing driving time to execute sensing. The detection electrodes Rx output sensor signals necessary for sensing (i.e., signals based on variation in inter-electrode capacitance between the sensor drive electrodes Tx and the detection electrodes Rx) in accordance with supply of the sensor drive signals to the sensor drive electrodes Tx. The detection signals output from the detection electrodes Rx are input to the detection circuit RC shown in FIG. 1.

The sensor SS in each of the above-explained configuration examples is not limited to the sensor of the mutual-capacitive type which detects the object based the variation in electrostatic capacitance between a pair of electrodes (in the above case, the electrostatic capacitance between the drive electrodes Tx and the detection electrodes Rx), but may be a self-capacitive type which detects an object based on the variation in electrostatic capacitance between the detection electrodes Rx.

In the example illustrated, the drive electrodes Tx each extend along the second direction Y and arranged along the first direction X with a gap between each adjacent pair, but the drive electrodes Tx each may extend along the first direction X and arranged along the second direction Y with a gap between each adjacent pair. In this case, the detection electrodes Rx each extend along the second direction Y and are arranged along the first direction X with a gap between each adjacent pair.

FIG. 5 is a diagram showing a configuration example of the detector RS in the detection electrode Rx1 shown in FIG. 1.

In the example shown in FIG. 5(A), the detector RS is formed of mesh-shaped metal wires MS. The metal wires MS are joined to the terminal RT1. In the example shown in FIG. 5(B), the detector RS is formed of wave-shaped metal wires MW. In the example illustrated, the metal wires MW are formed in a sawtooth shape but may be in some other shape such as a sine wave shape. The metal wires MW are joined to the terminal RT1.

The terminal RT1 is formed of, for example, the same material as that of the detector RS. A circular contact hole V1 is formed in the terminal RT1.

Figure 6:
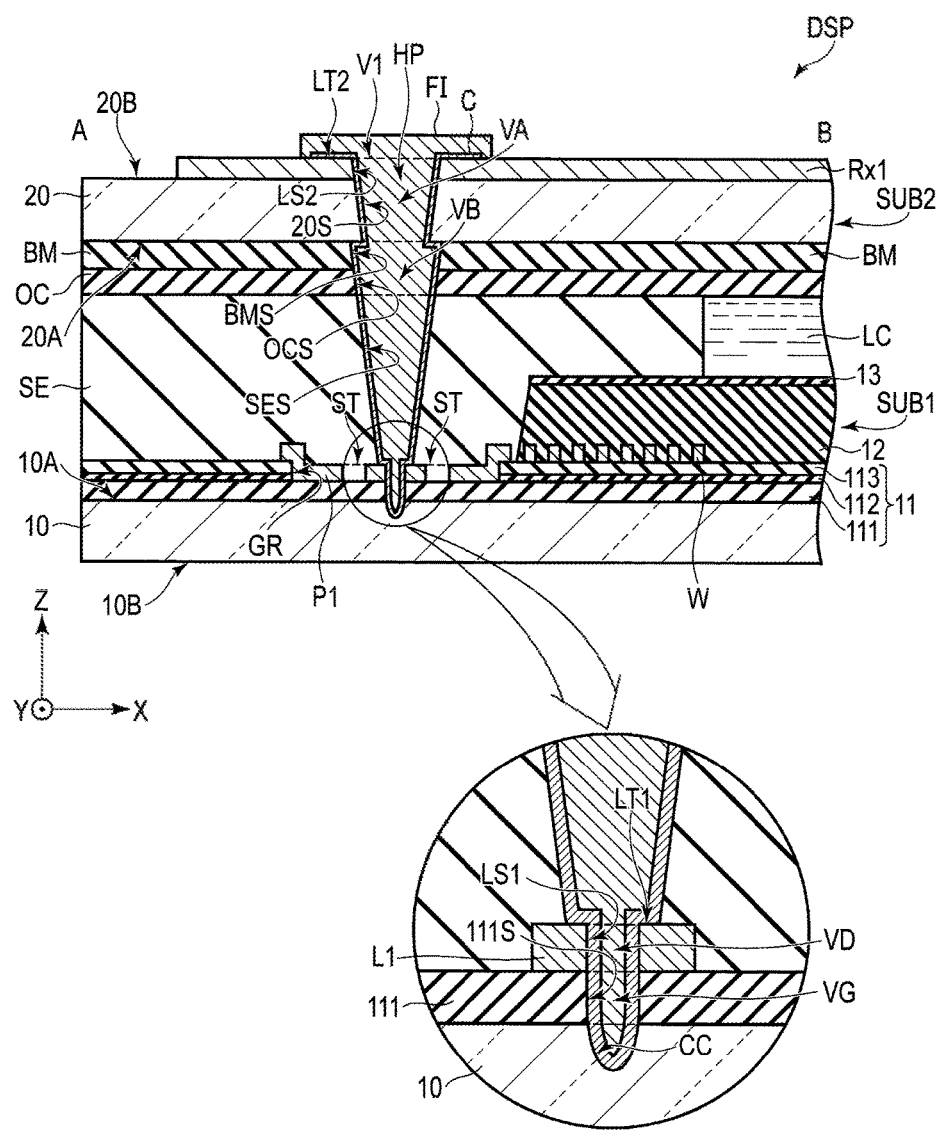
FIG. 6 is a cross section of the display panel taken along a line A-B shown in FIG. 1 including a contact hole.

FIG. 6 is a cross-sectional view showing the display panel PNL including the contact hole V1 shown in FIG. 1 as taken along in line A-B. Here, only main parts necessary for the explanation are shown, and the first alignment film, the second alignment film and the like are omitted from the illustration.

In the example illustrated, the display device DSP comprises a first substrate SUB1, a second substrate SUB2, a sealing material SE, a liquid crystal layer LC, a connecting material C and a filling material FI.

The first substrate SUB1 includes a first basement 10, a pad P1, wiring lines W, a first insulating layer 11, a second insulating layer 12, a third insulating layer 13, etc.

The first insulating layer 11 comprises an insulating layer 111, an insulating layer 112 and an insulating layer 113. The insulating layer 111, the insulating layer 112, and the insulating layer 113 are stacked in this order on the first basement 10. The first insulating layer 11 comprises a recess GR. In the example illustrated, the recess GR penetrates the insulating layers 112 and 113 to the insulating layer 111. Moreover, although will not be described in detail, in the display area, a semiconductor layer of the switching element is arranged between the insulating layer 111 and the insulating layer 112, and the scanning line G shown in FIG. 2 is arranged between the insulating layer 112 and the insulating layer 113.

In the example illustrated, the pad P1 is located on a surface 10A side of the first basement 10 and disposed inside the recess GR. That is, the pad P1 is in contact with the insulating layer 111. Moreover, the wiring lines W are arranged on the insulating layer 113. Here, the wiring lines W are located, for example, in the same layer as that of the signal lines formed in the display area. In this embodiment, the pad P1 is formed, for example, of the same material as that of the signal lines S shown in FIG. 3 all together in one step. The pad P1 comprises a plurality of slits SL opposing the sealing material SE along the third direction Z. The second insulating layer 12 covers the wiring lines W, and is arranged also on the insulating layer 113. In the example illustrated, the second insulating layer 12 is not arranged on the pad P1. The pad part P1 is arranged mainly on the insulating layer 111, and is connected to the wiring lines W formed on the insulating layer 113. The third insulating layer 13 is arranged on the second insulating layer 12.

Note the insulating layer 111 may penetrate even the first basement 10 in the position which overlaps the recess GR, and the pad P1 disposed inside the recess OR may be in contact with the first basement 10.

The second substrate SUB2 comprises the second basement 20, the detection electrode Rx1, the light-shielding layer BM, the overcoat layer OC, etc.

The surface 20A of the second basement 20 opposes the first substrate SUB1 and is spaced from the first substrate SUB1. The detection electrode Rx1 is located in the surface 20B of the second basement 20. Although not illustrated, various insulating layers and conductive layers may be arranged between the second basement 20 and the detection electrode Rx2. The light-shielding layer BM is located in the surface 20A of the second basement 20. The overcoat layer OC covers the light-shielding layer BM. The sealing material SE is provided between the first substrate SUB1 and the second substrate SUB2. As described above, the pad P1 comprises the slits SL in the position overlapping the sealing material SE. With this configuration, ultraviolet rays radiated from below the display device DSP can reach the sealing material SE to harden. The liquid crystal layer LC is located in the region surrounded by the first substrate SUB1, the second substrate SUB2 and the sealing material SE.

Although not illustrated, the first alignment film may be disposed on a sealing material SE side of the first substrate SUB1. Further, the second alignment film may be arranged on a sealing material SE side of the second substrate SUB2. In this case, the first alignment film extends out to an end of the first substrate SUB1, and the second alignment film extends out to an end of the second substrate SUB2.

Here, the connection structure of the pad P1 and detection electrode Rx1 in this embodiment will be described in detail. In the second substrate SUB2, the second basement 20 comprises a hole VA which penetrates between the surface 20A and the surfaces 20B. In the example illustrated, the hole VA penetrates also the detection electrode Rx1. Further, the display panel PNL comprises a hole VB which penetrates the light-shielding layer BM, the overcoat layer OC and the sealing material SE. The hole VB opposes the hole VA along the third direction Z.

On the other hand, in the first substrate SUB1, the pad P1 comprises a hole VD which opposes the hole VA along the third direction Z. The insulating layer 111 comprises a hole VG communicating to the hole VD. Further, the first basement 10 comprises a recess CC which opposes the hole VD and the hole VG along the third direction Z. The hole VA, hole VB, hole VD, hole VG and the recess CC are arranged in this order along the third direction Z. The recess CC is formed toward the surface 10B from the surface 10A, but in the example illustrated, it does not penetrate to the surface 10B. For example, a depth of the recess CC along the third direction Z is about ⅕ to about ½ of a thickness of the first basement 10 along the third direction Z. Note that the first basement 10 may comprise a hole which penetrates between the surface 10A and the surfaces 10B in place of the recess CC.

The hole VD, the hole VG and the recess CC formed in the first substrate SUB1 are each located directly under the hole VA. The holes VA, VB, VD, VG and the recess CC are located on the same straight line along the third direction Z, and form the contact hole V1.

The connecting material C passes through the contact hole V1 to electrically connect the pad P1 and detection electrode Rx1 to each other. That is, the connecting material C is provided on an inner surface of each of the holes VA, VB, VD, VG and the recess CC. In the example illustrated, in the second substrate SUB2, the connecting material C is in contact with each of an upper surface LT2 of the detection electrode Rx1, an inner surface LS2 of the detection electrode Rx1 in the hole VA, an inner surface 20S of the second basement 20 in the hole VA, an inner surface BMS of the light-shielding layer BM in the hole VB and an inner surface OCS of the overcoat layer OC in the hole VB. The inner surfaces LS2 and 20S form the inner surface of the hole VA. Further, the connecting material C is in contact with the inner surface SES of the sealing material SE in the hole VB.

The inner surfaces BMS, OCS and SES form the inner surface of the hole VB.

Moreover, in first substrate SUB1, the connecting material C is in contact with each an upper surface LT1 of the pad P1, an inner surface LS1 of the pad P1 in the hole VD, an inner surface 111S of the insulating layer 111 in the hole VG and also the recess CC. The connecting material C comprises a hollow HP in the holes VA, VB, VD and VG, and the recess CC.

In the example illustrated, the connecting material C is provided on the inner surface of each of the holes VA, VB, VD and VG, and the recess CC, but the material may fill the inside of the holes VA, VB, VD and VG and the recess CC so as to burry these. In such a case, the connecting material C is formed continuously between the pad P1 and the detection electrode Rx1 without a break.

The pad P1 and the detection electrode Rx1 are formed from, for example, a metal material such as molybdenum, tungsten, titanium, aluminum, silver, copper or chromium, or an alloy of any combination of these metal materials, or a transparent conductive material indium tin oxide (ITO) or indium zinc oxide (IZO), and may be of a single- or multi-layer structure. The connecting material C should preferably contain a metal material such as silver and fine particles having a diameter of the order of from several nanometers to tens of nanometers.

The hollow HP of the connecting material C is filled with the filling material FI. Further, the filling material FI is provided also on the detection electrode Rx1. The filling material FI has, for example, insulating properties and is formed from an organic insulating material. With the filling material FI thus arranged, the difference in level along the third direction Z, resulting from the formation of the hollow HP in the connecting material C can be reduced. Further, the connecting material C can be protected. Note that the filling material FI may be conductive, and prepared, for example, by hardening a paste containing conductive particles such as of silver. With the conductive filling material FI, even if the connecting material C is broken off, the filling material FI can electrically connect the pad P1 and the detection electrode Rx1 to each other, thereby making it possible to improve the reliability.

According to the display device DSP comprising the sensor SS described above, the detection electrode Rx1 provided in the second substrate SUB2 is connected to the pad P1 provided in the first substrate SUB1 by the connecting material C provided in the contact hole V1. Therefore, it is no longer necessary to mount a wiring board on the second substrate SUB2 in order to connect the pad P1 and the detection circuit RC. That is, the wiring substrate SUB3 mounted on the first substrate SUB1 forms a transmission line for transmitting signals necessary to display images on the display panel PNL, and also a transmission line for transmitting signals between the detection electrodes Rx and the detector RC. Therefore, as compared to the configuration example which requires individual wiring boards in addition to the wiring substrate SUB3, the number of wiring boards can be reduced. Moreover, the space for connecting the wiring boards to the second substrate SUB2 is not necessary, and therefore the non-display area of the display panel PNL, especially the width of the side edge in which the wiring substrate SUB3 is mounted can be decreased. Thus, the degree of freedom in the layout of the frame of the second substrate SUB2 can be improved. Thereby, the width of the frame can be reduced.

Figure 7:
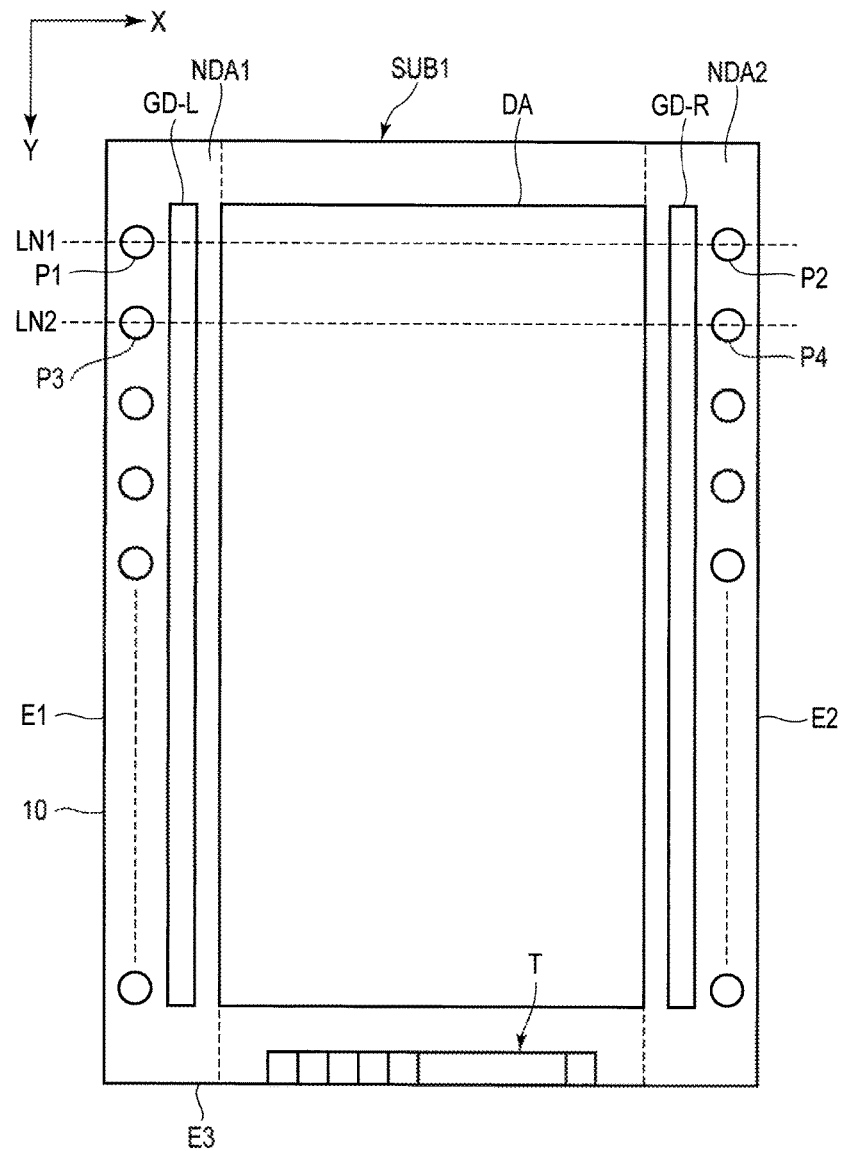
FIG. 7 is a plan view showing a first basement, pads and a scanning line drive circuit in a first substrate in relative positions to each other.

FIG. 7 is a plan view showing positions of the first basement 10, the pads P, scanning line drive circuits GD-L and GD-R in the first substrate SUB1 with relative to each other.

The first basement 10 comprises a long edge E1, a long edge E2 on an opposite side to the long edge E1, and a short edge E3 connected with the long edges E1 and E2. The long edges E1 and E2 extend along the second direction Y. The short edge E3 extends along the first direction X. Here, the long edge E1 corresponds to a first edge and the short edge E3 corresponds to a second edge. The first substrate SUB1 comprises a terminal T disposed along the short edge E3. To the terminal T, various wiring lines including those connected to the pads and the common electrode are connected, which will be described later. The non-display area NDA located on the outer side of the display area DA comprises a first non-display area NDA1 along the long edge E1, and a second non-display area NDA2 along the long edge E2. That is, the second non-display area NDA2 is located on an opposite side to the first non-display area NDA1 while interposing the display area DA therebetween. The scanning line drive circuit GD-L is located on the first non-display area NDA1. The scanning line drive circuit GD-R is located on the second non-display area NDA2.

The pads P1 and P3 are located on the first non-display area NDA1 and are arranged between the long edge E1 and the scanning line drive circuit GD-L. The pads P1 and P3 are arranged along the second direction Y. On the other hand, the pads P2 and P4 are located on the second non-display area NDA2 and are arranged between the long edge E2 and the scanning line drive circuit GD-R. The pads P2 and P4 are arranged along the second direction Y. The pads P1 and P2 are located on the same straight line LN1 parallel to the first direction X. The pads P3 and P4 are located on the same straight line LN2 parallel to the first direction X. Here, only the pads P1 to P4 are illustrated, but other pads are arranged similarly. For example, the odd-numbered pads are arranged along the second direction Y at the same pitch as that of the pads P1 and P3 in the first non-display area NDA1, whereas the even-numbered pads are arranged along the second direction Y at the same pitch as that of the pads P2 and P4 in the second non-display area NDA2.

FIG. 8 is a plan view showing the shape of the detection electrodes Rx1 and Rx2, the positions of the pads P1 and P2 with relative to each other, etc.

In the example illustrated, the second substrate SUB2 comprises the detection electrodes Rx1 and Rx2 located on the surface 20B. The detection electrodes Rx1 and Rx2 are arranged along the second direction Y. A terminal RT1 is located on a long edge E1 side. The terminal RT1 comprises a projection RT1a projecting towards a detection electrode Rx2 side. A terminal RT2 is located on a long edge E2 side. The terminal RT2 comprises a projection RT2a projecting towards a detection electrode Rx1 side. The projection RT1a and projection RT2a are located on the same straight line LN parallel to the first direction X. Since the detection electrodes Rx1 and Rx2 comprise the terminals RT1 and RT2 having the above-described shape, they can be electrically connected to the pads P1 and P2 located on the same straight line LN. In the example illustrated, the contact hole V1 for connecting the pad P1 and the terminal RT1 to each other and the contact hole V2 for the pad P2 and the terminal RT2 to each other are also located on the same straight line LN. Note that as in the case of the hole VA shown in FIG. 6, the contact hole V2 comprises a hole VH which penetrates between the surfaces 20A and 20B. Further, the display device comprises a second connecting material C2 provided in through the hole VH to electrically connect the pad P2 and detection electrode Rx2 to each other.

FIG. 9 is a schematic plan view showing a part of the structure of the first substrate SUB1.

In the example illustrated, the first substrate SUB1 comprise the pads P1, P3, P5, P7, the wiring lines W1, W3, W5, W7, the shift registers SR1 to SR3, logical circuits LG1 to LG12, buffer circuits BF1 to BF12, wiring groups WG1 to WG3, the terminal T, the drive electrodes Tx1 and Tx2, etc. The drive electrodes Tx1 and Tx2 are disposed on the display area DA. The drive electrodes Tx1 and Tx2 are connected respectively to metal wiring lines MR in the non-display area NDA. The metal wiring lines MR are formed, for example, from the same material as that of the metal layer M shown in FIG. 3 and is located in the same layer as the metal layer M, i.e., between the second insulating layer 12 and the third insulating layer 13. The metal wiring lines MR are connected to the terminal portions T1 and T2 included in the terminal T.

The first wiring group GG1, second wiring group GG2 and third wiring group GG3 each extend along the first direction X in the display area DA, and arranged in this order along the second direction Y. The first wiring group GG1 comprises the scanning lines G1 to G4. The second wiring group GG2 comprises the scanning lines G5 to G8. The third wiring group GG3 comprises the scanning lines G9 to G12.

Note that the illustrated structure is merely an example, and, for example, the number of scanning lines connected to each of the first to the third wiring groups GG1 to GG3 is not limited to this, but there may be more than four scanning lines. For example, structure may comprise forty scanning lines connected to each of the wiring groups.

The shift registers SR1 to SR3 are arranged in this order along the second direction Y with respective gaps therebetween. As will be described later, each of the shift registers SR1 to SR3 comprises circuit elements such as transistors. The regions of the shift registers indicated by rectangles shown in the drawing are regions on each of which the circuit elements are integrated. No circuit elements are provided in each pap between adjacent pairs of the shift registers arranged along the second direction Y, to reserve regions where various wiring lines can be provided. The shift register SR1 is connected to the logical circuits LG1 to LG4. The shift register SR2 is connected to the logical circuits LG5 to LG8. The shift register SR3 is connected to the logical circuits LG9 to LG12.

The buffer circuits BF1 to BF4 are connected respectively to the scanning lines G1 to G4 included in the first wiring group GG1. The buffer circuits BF5 to BF8 are connected respectively to the scanning lines G5 to G8 included in second wiring group GG2. The buffer circuits BF9 to BF12 are connected respectively to the scanning lines G9 to G12 included in the third wiring group GG3.

The logical circuits LG1 to LG12 are connected respectively to the buffer circuits BF1 to BF12. The logical circuits LG1 to LG4 select any of the scanning lines G1 to G4 based on an output signal from the shift register SR1. The logical circuits LG5 to LG8 select any of the scanning lines G5 to G8 based on an output signal from the shift register SR2. The logical circuits LG9 to LG12 select any of the scanning lines G9 to G12 based on an output signal from the shift register SR3.

That is, the shift register SR1 is connected to the first wiring group GG1. The shift register SR2 is connected to the second wiring group GG2. The shift register SR3 is connected to the third wiring group GG3.

The pads P1, P3, P5 and P7 are arranged along the second direction Y. The pad P3 is located closer to the short edge E3 side than the pad P1, and is situated between the shift registers SR1 and SR2. The pad P5 is located closer to the short edge E3 side than the pad P3, and is situated between the shift registers SR2 and SR3. The pad P7 is located closer to the short edge E3 side than the pad P5. In other words, the shift register SR1 is disposed between the pad P1 and the pad P3. The shift register SR2 is disposed between the pad P3 and the pad P5. The shift register SR3 is disposed between the pad P5 and the pad P7.

In the example illustrated, each pad is located between two shift registers, or more specifically, between one of the semiconductors which constitute one shift register, which is nearest to the respective pad and one of those which constitute the other shift register. In more detail, each pad is formed in a position which does not overlap the semiconductor layers which constitute the respective shift register along the first direction X. Here, a further description will now be provided by focusing on the pad P3 and the shift registers SR1 and SR2 as an example. Let us assume that, of the plurality of semiconductor layers which constitute a shift register SR1, one located closest to the pad P3 is referred to as a semiconductor SCD1, whereas, of the plurality of semiconductor layers which constitute a shift register SR2, one located closest to the pad P3 is referred to as a semiconductor SCD2. Then, the pad P3 is located between the semiconductors SCD1 and SCD2 as viewed along the second direction Y. Further, the pad P3 does not overlap the semiconductors SCD1 and SCD2 along the first direction X.

In the example illustrated, the shape of the pad P1, P3, P5 and P7 is circular, but it is not limited to this example. The pad P1, P3, P5 and P7 may be formed into various shapes such as octagonal and, as shown in FIG. 1, trapezoidal.

The wiring line W1 is connected to the pad P1. The wiring line W3 is connected to the pad P3. The wiring line W5 is connected to the pad P5. The wiring line W7 is connected to the pad P7. The wiring lines W1 and W3 are arranged along the first direction X between the long edge E1 and the shift register SR2, and each extend along the second direction Y. The wiring lines W1, W3 and W5 are arranged along the first direction X between the long edge E1 and the shift register SR2 and each extend along the second direction Y. Further, the wiring line W1 detours around the scanning line drive circuit GD side of the pad P3. That is, the wiring line W1 detours between the shift register SR1 and the pads P3 and between the shift register SR2 and the pad P3. Further, the wiring lines W1 and W3 detours around the scanning line drive circuit GD of the pad P5. That is, the wiring line W1 and W3 detours between the shift register SR2 and the pad P5 and between the shift register SR3 and the pad P5. When the wiring lines W make detours, each should preferably be arranged for the shortest route so as to be able to suppress the increase in length of the wiring lines (or increase in wiring resistance). For example, in the case of the wiring line W1 which detours around the pad P3, it should preferably be arranged substantially parallel to the edge of the pad P3 on a scanning line drive circuit GD side at substantially a constant interval, and when the pad P3 is circular, the detouring path of the wiring line W1 should preferably be circular along the edge of the pad P3. When the pad is polygonal, the detouring path of the wiring line should preferably be similar in shape to the edge of the pad.

Note that the wiring line W1 may detour an opposite side to the scanning line drive circuit GD side of the pad P3. The wiring lines W1 and W3 may detour an opposite side to the scanning line drive circuit GD side of the pad P5.

The wiring line W1 is connected to the terminal portion T3 included in the terminal T. The wiring line W3 is connected to the terminal portion T4 included in the terminal T. The wiring line W5 is connected to the terminal portion T5 included in the terminal T. The wiring line W7 is connected to the terminal T6 included in the terminal T. The wiring lines W1, W3, W5 and W7 each comprise a part PT1 on a side to be connected to the respective one of the pads P1, P3, P5 and P7 and a part PT2 on another side to be connected to the terminal T. The part T1 is formed, for example, from the same material as that of the signal lines S shown in FIG. 3 and is located in the same layer as that of the signal lines S while extending between the long edge E1 and the scanning line drive circuits GD along the second direction Y. The part T2 extends in the non-display area NDA along an oblique direction different from the first direction X or the second direction Y, and is formed, for example, from the same material as that of the metal wiring lines MR and located between the second insulating layer 12 and the third insulating layer 13 as in the case of the metal layer M shown in FIG. 3. The terminal portions T1 to T6, the part T2 and the metal wiring lines MR are arranged between the short edge E3 and the display area DA. In the vicinity of the terminal T between the short edge E3 and the display area DA, for example, the metal wiring lines MR and the part T2 are arranged parallel to each other. Note that the terminal portions T1 to T6 are arranged along the short edge E3 of the first basement 10 in the first direction X.

According to this embodiment, the detection electrodes Rx provided in second substrate SUB2 and the pads P respectively connected thereto are arranged along the second direction Y between the long edge of the first substrate SUB1 and the scanning line drive circuit GD. Further, each of the pads P is located between a respective adjacent pair of the shift registers SR arranged along the second direction Y, and therefore a region can be reserved for arranging wiring lines in the gap between each adjacent pair of shift registers SR. The wiring lines W for connecting the pads P to the terminal T detour around between the pad P and the shift register SR, and thus they can be arranged by utilizing the gaps between adjacent shift registers. With this structure, as compared to the case where the wiring lines W are provided between the pads P and the long edges E1 of the substrate or the case where they are linearly arranged between the pads P and the scanning line drive circuit GD without detouring around the pads P, the width from the long edge E1 of the substrate to the display area DA along the first direction X can be reduced.

Figure 10:
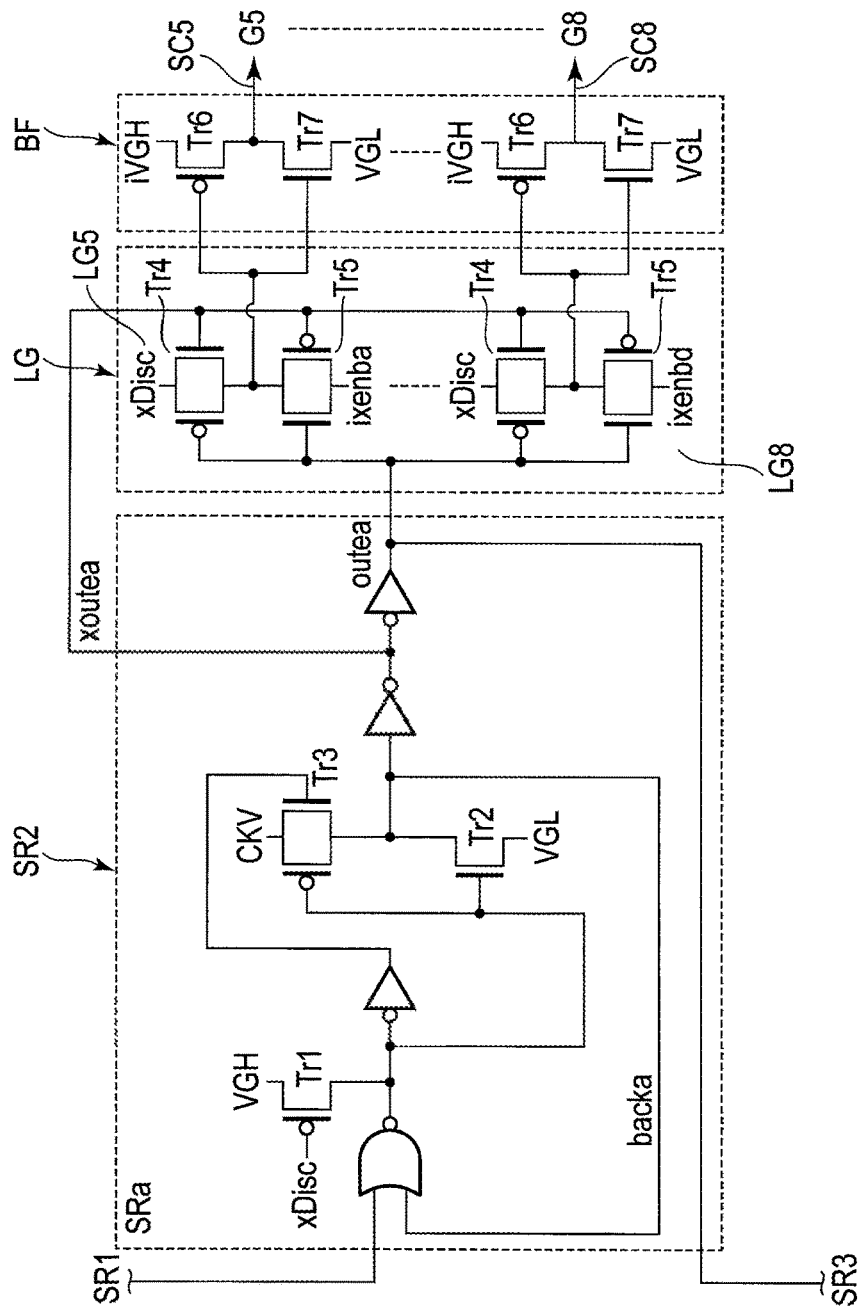
FIG. 10 is a circuit diagram showing a shift register, a logical circuit and a buffer circuit shown in FIGS. 9 and 10.

FIG. 10 is a circuit diagram showing a shift registers SR, logical circuits LG and buffer circuits BF shown in FIG. 9. Here, the description will be focused on the shift register SR2, the logical circuits LG5 to LG8 and the buffer circuits BF5 to BF8 as an example.

As shown in FIG. 10, the shift register SR2 comprises an input terminal to which an output signal from the preceding shift register SR1 is input, an output terminal which outputs an output signal of the shift register SR2 itself, and an inverted output terminal which outputs an inverted output signal obtained by inverting the output from the shift register SR2 itself. The output signal from the shift register SR2 is output to the logical circuits LG5 to LG8 and the succeeding shift register SR3. The inverted output signal from the shift register SR2 is output to the logical circuits LG5 to LG8.

The shift register SR2 comprises a switch Tr1, a switch Tr2 and a switch Tr3. The switch Tr1 is formed from a P-type TFT, the switch Tr2 is an N-type TFT and the switch Tr3 is formed from a P-type TFT and an N-type TFT connected in parallel. Each logical circuit LG comprises a switch Tr4 and a switch Tr5. Each of the switches Tr4 and Tr5 is formed from a P-type TFT and an N-type TFT connected in parallel. Each buffer circuit BF comprises a switch Tr6 and a switch Tr7. The switch Tr6 is formed from a P-type TFT and the switch Tr7 is from an N-type TFT.

The shift register SR2, the logical circuits LG and the buffer circuits BF supply control signals SC to the scanning lines G, to apply a voltage of the first level or the second level to the scanning lines G. One of the first level and the second level is a high (H) level and the other side is a low (L) level.

For example, if a signal xDisc of the L level is input to the shift register SR2 and the logical circuits LG, the switch Tr1 is turned on to allow a voltage signal VGH of the H level to flow through the switch Tr1. Then, the switch Tr2 is turned on, whereas the switch Tr1 is turned off. Thus, a voltage signal VGL of the L level flows through the switch Tr2. Thereby, the shift register SR2 outputs an output signal outea of the L level and an inverted output signal xoutea of the H level.

In the logical circuits LG5 to LG8, the switch Tr4 is turned on, whereas the switch Tr5 is turned off. Thereby, a signal xDisc of the L level flows through the switch Tr4 and is applied to the buffer circuits BF.

In the buffer circuits BF, the switch Tr6 is turned on, whereas the switch Tr7 is turned off. Thereby, a voltage iVGH of the first level gives rise to a control signal SC and flows through switch Tr6, and is applied to the scanning lines G. In this manner, the potential of the scanning lines G can be reset.

Then, when the output of the H level is input to the shift register SR2 from the preceding shift register SR1, the switch Tr2 is turned off, whereas the switch Tr3 is turned on. A signal CKV, which is a pulse signal, flows through the switch Tr3. Then, a signal CKV of the H level flows through the switch Tr3, and thereby the shift register SR2 outputs the output signal outea of the H level and the inverted output signal xoutea of the L level.

In the logical circuits LG5 to LG8, the switch Tr5 is turned off, whereas the switch Tr4 is turned on. Thereby, signals ixenb flow through the switch Tr5 of each logical circuit LG and are applied to the corresponding buffer circuit BF. In detail, a signal ixenba flows through the switch Tr5 of the logical circuit LG55, whereas a signal ixenbd flows through the switch Tr5 of the logical circuit LG8. Although not illustrated, a signal ixenbb flows through the switch Tr5 of the logical circuit LG6, whereas a signal ixenbc flows through the switch Tr5 of the logical circuit LG7. The timings at which the signals ixenba, ixenbb, and ixenbc and ixenbd shift their voltage levels are different from each other.

As shown in FIG. 10 and FIG. 11, during a first period PR1, the voltage level of the signal ixenba shifts to the H level, whereas the voltage level of the signals ixenbb, ixenbc and ixenbd shifts to the L level.

During a second period PR2, which follows the first period PR1, the voltage level of the signal ixenba shifts to the L level, the voltage level of the signal ixenbb shifts to the H level, and the voltage level of the signals ixenbc and ixenbd maintains at the L level.

During a third period PR3, which follows the second period PR2, the voltage level of the signal ixenba maintains at the L level, the voltage level of the signal ixenbb shifts to the L level, the voltage level of the signal ixenbc shifts to the H level, and the voltage level of the signal ixenbd maintains at the L level.

During a fourth period PR4, which follows the third period PR3, the voltage level of the signals ixenba and ixenbb maintains at the L level, the voltage level of the signal ixenbc shifts to the L level, and the voltage level of the signal ixenbd shifts to the H level.

The switch Tr7 of each of the buffer circuits BF5 to BF8 is turned on in a time-division manner.

Thereby, during the first period PR1, the buffer circuit BF5 supplies a voltage VGL of the second level as a control signal SC to the scanning line G5. During the second period PR2, the buffer circuit BF6 supplies a voltage VGL of the second level as a control signal SC to the scanning line G5. During the third period PR3, the buffer circuit BF7 supplies a voltage VGL of the second level as a control signal SC to the scanning line G5. During the fourth period PR4, the buffer circuit BF8 supplies a voltage VGL of the second level as a control signal SC to the scanning line G5. With the above-described operations, the scanning lines G5 to G8 can be driven in a time-division manner.

FIG. 12 is a cross section showing the first substrate SUB1 taken along line C-D shown in FIG. 9. Here, only main parts necessary for the explanation are shown in FIG. 12.

In the example illustrated, the first substrate SUB1 comprises transparent conductive layers TC on the third insulating layer 13, which superimpose above the parts T2 of the wiring lines. The parts T2 are parts of the wiring lines formed from the same material as that of the metal layer M, etc., and are located between the second insulating layer 12 and the third insulating layer 13. The transparent conductive layers TC are, for example, electrically floating, but may be connected to a terminal portion of a ground potential or a specific fixed potential. The transparent conductive layers TC are is formed, for example, from the same material as that of the pixel electrodes PE shown in FIG. 3, which is a transparent conductive material such as ITO or IZO.

In an example shown in FIG. 12(A), the transparent conductive layers TC have the same shape as that of the parts T2 of the wiring lines W, and a width WT1 of each transparent conductive layer TC located directly above a respective part T2, taken along the line C-D is the same as a width WT2 of the part T2 of an wiring line, taken along the line C-D. Therefore, when the first substrate SUB1 is seen in plan view, the transparent conductive layers TC respectively superimpose on the parts T2.

In an example shown in FIG. 12(B), the shape of the transparent conductive layer TC is different from the parts T2, and the width WT1 of the transparent conductive layer TC is greater than the width WT2 of each part T2. One transparent conductive layer TC is located directly above gaps between adjacent pairs of the part T2 and also directly above the parts T2 themselves (six parts T2 in the example illustrated). When the first substrate SUB1 is seen in plan view, the transparent conductive layer TC superimposes on these parts T2.

With the above-described structure in which the transparent conductive layer(s) TC superimposes on the parts T2, it is possible to suppress moisture from entering from above the first substrate SUB1 to the parts T2. Therefore, the parts T2, which are formed of metal, can be prevented from corroding.

Moreover, as compared to the case of forming wiring lines only in the same layer as those of the scanning lines and the signal lines S, wiring lines can be formed in the same layers as those of the scanning lines, the signal lines S and the metal layers M. Therefore, the wiring density per layer can be reduced. As described, by making the wiring lines in multi-layers, the installation area of the wiring lines when the first substrate SUB1 is seen in plan view can be reduced, and therefore the area of the non-display area NDA between the display area DA and the short edge E3 can be reduced. Further, the length of the wiring lines routed around or the resistance of the wiring lines can be prevented from increasing.

FIG. 13 is a plan view of the first substrate SUB1, illustrating the positions of shift register SRn−1 and SRn adjacent to each other along the second direction Y, wiring lines W and a pad P with relative to each other.

The first substrate SUB1 comprises a wiring group WRG of a plurality of wiring lines W each extending along the second direction Y and arranged along the first direction X. The wiring group WRG detours around between the pad P and the shift register SRn−1 and between the pad P and the shift register SRn. In the example illustrated, the pad P is formed into an octagonal shape comprising three edges EG1 to EG3 on a display area DA side. The edge EG2 extends along the second direction Y. The edges EG1 and EG3 adjacent to the edge EG2 extend in oblique directions different from each other. The path of the outermost wiring line WOUT, which is closest to the long edge E1 among those of the wiring group WRG and detours around the pad P, includes portions WO1 to WO3 parallel to the edge EG1 to EG3, respectively. The interval from the edges EG1 to EG3 to the respective portions WO1 to WO3 is constant. In the wiring group WRG, wiring lines on a side closer to the display area DA than the outermost wiring line WOUT have detour paths similar to the shape of the portions WO1 to WO3. In the wiring group WRG, the detour path of the innermost wiring line WIN, which is closest to the display area DA is located between the shift registers SR1 and SR2. In the detour path of the innermost wiring line WIN, a portion WI2 parallel to the portion WO1 is located on a straight line LN3 connecting an output terminal OUTn−1 of the shift register SRn−1 and an output terminal OUTn of the shift register SRn between the shift register SR1 and the shift register SR2 and extends along the second direction Y. In the wiring groups WRG, portions parallel to the edge EG1 are located between the pad P1 and the shift register SRn−1 and portions parallel to edge EG3 are located between the pad P1 and the shift register SRn.

Moreover, the portions of the detour paths of this wiring lines W do not overlap, in plan view, any transistors which constitute the two adjacent shift registers SRn and SRn−1.

With application of such a layout, the width from the long edge E1 to the display area DA along the first direction X can be reduced.

Figure 14:
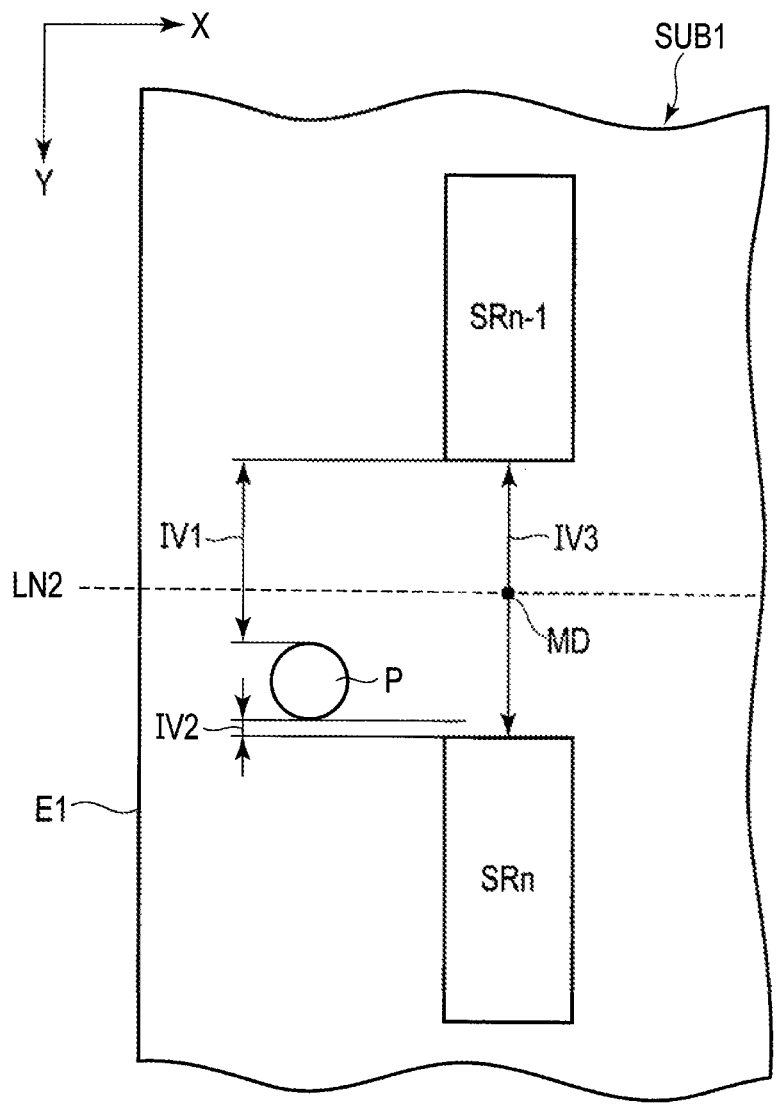
FIG. 14 is a plan view of the first substrate, showing shift registers and a pad at positions in relation to each other.

FIG. 14 is a plan view of the first substrate SUB1, illustrating the positions of shift register SRn−1 and SRn and a pad P with relative to each other.

An interval IV1 between the pad P and the shift register SRn−1 along the second direction Y is different from an interval IV2 between the pad P and the shift register SRn along the second direction Y. In the example illustrated, the interval IV1 is greater than the interval IV2. In other words, the pad P is located closer to the shift register SRn than a straight line LN crossing a middle point MD of an interval IV3 between the shift register SRn−1 and the shift register SRn along the second direction Y.

As described above, according to this embodiment, a display device in which the frame can be narrowed can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    a first substrate including a first basement, a first scanning wiring group and a second scanning wiring group each extending along a first direction and arranged along a second direction crossing the first direction in a display area which displays images, a first shift register of a scanning line driver circuit connected to the first scanning wiring group, a second shift register of the scanning line driver circuit connected to the second scanning wiring group and arranged to be spaced from the first shift register at an interval along the second direction, a first pad provided between the first shift register and the second shift register, and a third pad,
    a second substrate including a second basement comprising a first surface opposing the first substrate and spaced from the first substrate and a second surface on an opposite side to the first surface, and a first detection electrode located on the second surface, and comprising a first hole which penetrates to the first surface from the second surface; and
    a first connecting material provided through the first hole to electrically connect the first pad and the first detection electrode to each other, wherein
    the first pad and the third pad are arranged along the second direction, and
    the second shift register is located between the first pad and the third pad,
    the first basement has a first edge extending in the second direction, the second basement has a first edge extending in the second direction, the first edge of the first basement opposed to the first edge of the second basement,
    the scanning line driver circuit is located along the first edge of the first basement,
    the first hole is located between the first edge of the second basement and the scanning line driver circuit in the first direction in plan view, and
    the first scanning wiring group has four scanning lines, and the second scanning wiring group has four scanning lines.

2. The display device of claim 1, wherein the first substrate comprises either one of a buffer circuit connected to each of four scanning lines included in the first scanning wiring group and a logical circuit which selects one of the four scanning lines based on an output signal from the first shift register.

3. The display device of claim 1, wherein
    the first substrate further comprises a second pad,
    the first pad and the third pad are located in a first non-display area on an outer side of the display area,
    the second pad is located in the second non-display area on the opposite side to the first non-display area across the display area, and
    the first pad and the second pad are located on a same straight line parallel to the first direction.

4. The display device of claim 3, wherein the second substrate further comprises
    a second detection electrode located on the second surface, the first detection electrode and the second detection electrode being arranged along the second direction, and a second hole which penetrates to the first surface from the second surface, and
    a second connecting material provided through the second hole to electrically connect the second pad and the second detection electrode to each other.

5. The display device of claim 1, wherein
    the first substrate further comprises a first wiring line connected to the first pad and a first terminal connected to the first wiring line,
    the third pad is located closer to the first terminal than the first pad, and
    the first wiring line detours around between the third pad and the second shift register.

6. The display device of claim 1, wherein
    the first substrate comprises a wiring group each wiring line of which extends along the second direction and is arranged along the first direction,
    the wiring group detours around between the first pad and the first shift registers and between the first pad and the second shift register, and
    an innermost wiring line of the wiring group, which is closest to the display area, is located on a same straight line which connects a first output terminal of the first shift register and a second output terminal of the second shift register between the first shift register and the second shift register, and extends along the second direction.

7. The display device of claim 1, wherein an interval between the first pad and the first shift register is different from an interval between the first pad and the second shift register.

* * * * *